United States Patent [19]

Claeskens et al.

[11] Patent Number: 4,480,780
[45] Date of Patent: Nov. 6, 1984

[54] METHOD OF AND DEVICE FOR POSITIONING ELECTRICAL AND/OR ELECTRONIC COMPONENTS ON A SUBSTRATE

[75] Inventors: Louis V. Claeskens; George Van de Ven, both of Eindhoven, Netherlands

[73] Assignee: U.S. Philips Corporation, New York, N.Y.

[21] Appl. No.: 345,881

[22] Filed: Feb. 4, 1982

[30] Foreign Application Priority Data

Jul. 29, 1981 [NL] Netherlands ............... 8103574

[51] Int. Cl.³ ............................................. H01L 21/60
[52] U.S. Cl. ........................... 228/180 A; 29/743; 29/759; 29/834; 228/6 A; 228/7; 228/47; 414/736; 414/737
[58] Field of Search ............... 228/6 A, 47, 8, 7, 102, 228/180 A; 29/740, 759, 834, 836, 743; 414/627, 736, 737, 752, 750; 198/427, 428, 486

[56] References Cited

U.S. PATENT DOCUMENTS

| | | | |
|---|---|---|---|
| 3,958,740 | 5/1976 | Dixon | 228/6 A X |
| 4,119,211 | 10/1978 | Boyer et al. | 414/627 X |
| 4,151,945 | 5/1979 | Ragard et al. | 228/6 A |
| 4,307,832 | 12/1981 | Taki et al. | 228/6 A X |
| 4,342,090 | 7/1982 | Caccoma et al. | 29/740 X |

*Primary Examiner*—Kenneth J. Ramsey
*Attorney, Agent, or Firm*—David R. Treacy

[57] ABSTRACT

For the mounting of electrical and/or electronic components on a substrate, the components are presented in a pick-up position in a fixed, invariable pattern, preferably in a straight row. The components are simultaneously picked up in this pattern by a number of transfer devices and simultaneously moved toward their mounting positions over the substrate. During this transfer, they are moved different distances into a modified pattern with respect to one another, which corresponds to the desired pattern in which the components are to be positioned on the substrate. The transfer devices are programmed by means of exchangeable program plates.

28 Claims, 12 Drawing Figures

METHOD OF AND DEVICE FOR POSITIONING ELECTRICAL AND/OR ELECTRONIC COMPONENTS ON A SUBSTRATE

BACKGROUND OF THE INVENTION

The invention relates to a method of positioning electrical and/or electronic components on a substrate, a number of parts being simultaneously transferred from a pick-up position to a mounting position in order to be positioned on the substrate.

The increasing miniaturization in the electronics industry has given rise to the development of plate-shaped or block-shaped components devoid of connection wires, that is to say components which do not comprise the conventional comparatively long radial or axial connection wires.

These components without connection wires, also referred to as chip type components, either have contact areas on opposite faces or sides, such as capacitors, resistors, coils, or short connection studs, such as diodes and transistors. The components are arranged on a substrate having a printed wiring or circuit track pattern, with glue or solder paste being locally applied to the wiring or track side. The components have dimensions in the order of magnitude of millimeters, for example, 3.2×1.6 mm. In view of the small dimensions of the components and the density of the track pattern, the components must be very accurately positioned with respect to the tracks on the substrate.

A method of the kind set forth is known from U.K. Patent Application No. 2025910. According to the known method, the components are presented in the pick-up position in the same pattern in which they are to be positioned on the substrate. This pattern must be changed to match each different substrate pattern. This method is greatly dependent on the substrate and on the product and is not very flexible, which means that it is difficult to adapt the method to different substrates. The conversion times are comparatively long. Moreover, the components cannot be presented from a strip-shaped package like a tape, because the necessary space is lacking.

SUMMARY OF THE INVENTION

The invention has for its object to provide an improved method according to which the components are picked up, transferred and positioned on the substrate in a simple, quick and accurate manner.

This object in accordance with the invention is achieved mainly in that the components are presented in the pick-up position with a regular pitch in a geometrical pattern are picked up in this pattern, the picked up components prior to their positioning on the substrate being displaced with respect to one another and arranged into a modified pattern and ultimately being positioned on the substrate in the modified pattern which deviates from the geometrical pattern of the components in the pick-up position and which corresponds to the desired pattern of the components on the substrate.

Using the method in accordance with the invention, components can be presented and picked up in a simple first geometric pattern with a minimum pitch; this pattern is permanent and remains unmodified even for the positioning of the components on substrates comprising different track patterns and having different dimensions. The transfer of the components is performed very efficiently, because the transport time is used to arrange the components into the desired pattern. Moreover, thanks to the permanent unmodified pattern in which the components are presented, common devices, for example, the device for the feeding and presentation of the components, the device for the transfer of the components and other devices can be simply designed as a standard mechanism, regardless of the dimensions of the substrates and the track patterns. The components are positioned on the substrate either in rapid succession or group-wise, but preferably simultaneously.

A preferred embodiment of the method in accordance with the invention is characterized in that, during the transfer to the mounting positions, on a first path segment the components are displaced according to a straight line, parallel to one another and over the same distance; and they are subsequently displaced on a second path segment over different distances so that their relative positions are changed to a second, different geometric pattern. On the first path segment, the components can be subjected to a common operation, for example, simultaneous alignment; on the second path segment, the components are arranged in the desired pattern.

Because in a further preferred embodiment of the method in accordance with the invention the components are positioned in a direction transversely of the transport direction with respect to one another on the second path segment, a small overlap of the positioning zones of the components on the substrate in the transverse direction can be obtained.

In a further preferred embodiment of the method in accordance with the invention components are presented in the pick-up position in a straight line pattern. In this embodiment, the components can be presented and picked up in the simplest manner, for example, in one row.

A further preferred embodiment of the method in accordance with the invention is characterized in that a fixing medium is applied to all components simultaneously on the first path segment. As a result of the direct application of the fixing medium to the components on the first path segment, the same simple device can be used for the application of a fixing medium to components to be positioned on different substrates. For the fixing medium use can be made of glue, a glue component, an activator, solder paste etc.

Thanks to the method in accordance with the invention, substrates can be provided with components in a fast, cheap and reproducible manner, the transport paths of the components being comparatively short and mainly rectilinear.

The invention also relates to a device for performing the method, comprising a frame, a transfer mechanism with pick-ups, a drive mechanism and a carrier for a substrate; the device in accordance with the invention is characterized in that the transfer mechanism comprises a number of transfer arms, each of which comprises a pick-up, said transfer arms being coupled to a common drive element, being slidable with respect to one another in a common guide, being displaceable between a pick-up position and a mounting position, and cooperating with abutments which define the pick-up position and the mounting position of the individual transfer arms. As a result of these structural relationships, that is to say the combination of a number of transfer arms which are slidable with respect to one another with a common drive element, a comparatively simple and compact construction is obtained. The device in accordance with the invention offers a high production rate against a comparatively low investment.

A preferred embodiment of the device in accordance with the invention is characterized in that the common guide is formed by a slide which is coupled to the drive mechanism and in which the transfer arms are journalled. The slide enables simple and efficient common displacement of all transfer arms simultaneously as well as relative displacements of the transfer arms with respect to one another.

Another preferred embodiment of the device in accordance with the invention is characterized in that at least the abutments which define the mounting position of the transfer arms are provided on an exchangeable program plate which is common to all transfer arms. Merely by exchanging the program plate, the device can be very quickly and simply converted and adapted to the mounting of components on different substrates. The mounting positions of all transfer arms are laid down in this program plate by means of the abutments. By simply exchanging the program plate, the mounting positions of all transfer arms can be simultaneously changed. The abutments on the program plate may be fixed, in which case the program plate contains a fixed program. However, the abutments may also be adjustable, in which case the abutments can be adjusted outsdie the device. For the mounting of components on different substrates, different program plates can be stored, one for each substrate.

In another preferred embodiment of the device in accordance with the invention, the abutments which define the pick-up position of the transfer arms are permanently arranged on the frame with a regular pitch. As a result of this step, a fixed, invariable pick-up position of the transfer arms is defined, regardless of the mounting position of the transfer arms and regardless of the various program plates. In the pick-up position of the transfer arms, the positions of the various pick-ups coincide with the pick-up positions of the components to be picked up.

In another preferred embodiment of the device in accordance with the invention, a small transverse displacement of the pick-ups is possible in that the program plate comprises guides for the positioning of the transfer arms and the pick-ups in a direction transversely of the slide movement. As a result of such positioning of the pick-ups, some overlap of the components on the substrate can be realized, as viewed in the direction of the slide movement.

Another preferred embodiment of the device in accordance with the invention is characterized in that each guide connects an abutment on the program plate to a catch element on the entrance side of the program plate, the catch elements being arranged with a regular pitch. Reliable and accurate guiding of the transfer arms and hence of the pick-ups is thus realized from the entrance side of the program plate to an abutment which defines the mounting position.

In another preferred embodiment of the device in accordance with the invention, each of the pick-ups on the transfer arms comprises a finger for cooperation with the program plate. Because the pick-ups define the ultimate positions of the components in their mounting position, the most accurate positioning of the parts is realized by the direct cooperation of program plate and pick-ups.

A further preferred embodiment of the device in accordance with the invention is characterized in that each pick-up comprises a pipette which is rotatably journalled in a housing and which is coupled to a pinion engaging a rack adapted to cooperate with an abutment on the program plate for rotation of the pipette. Thanks to these steps, the program plate can be simply used to realize a rotation of the pipettes and hence a rotation of the picked-up components about a perpendicular axis.

A final preferred embodiment of the device in accordance with the invention is characterized in that it comprises a mechanism for applying a fixing medium to the components. Such a mechanism comprises mainly an elongate arm which comprises a number of stamps, the arm being displaceable between a rest position in which the stamps can pick up a quantity of fixing medium, and an operating position in which the stamps can be brought into contact with the lower side of the picked-up components.

The described simple mechanism enables application of a fixing medium to all parts simultaneously, for example to the lower side of the parts, while the parts are still in the same simple pattern in which they have been picked up by the pick-ups. Because this pattern is independent of the substrate, the described mechanism is not specific of a given substrate or a given track pattern, so it need not be exchanged when the program plate is exchanged.

The invention will be described in detail hereinafter with reference to the drawing.

DESCRIPTION OF THE PREFERRED EMBODIMENTS

Figure 1:
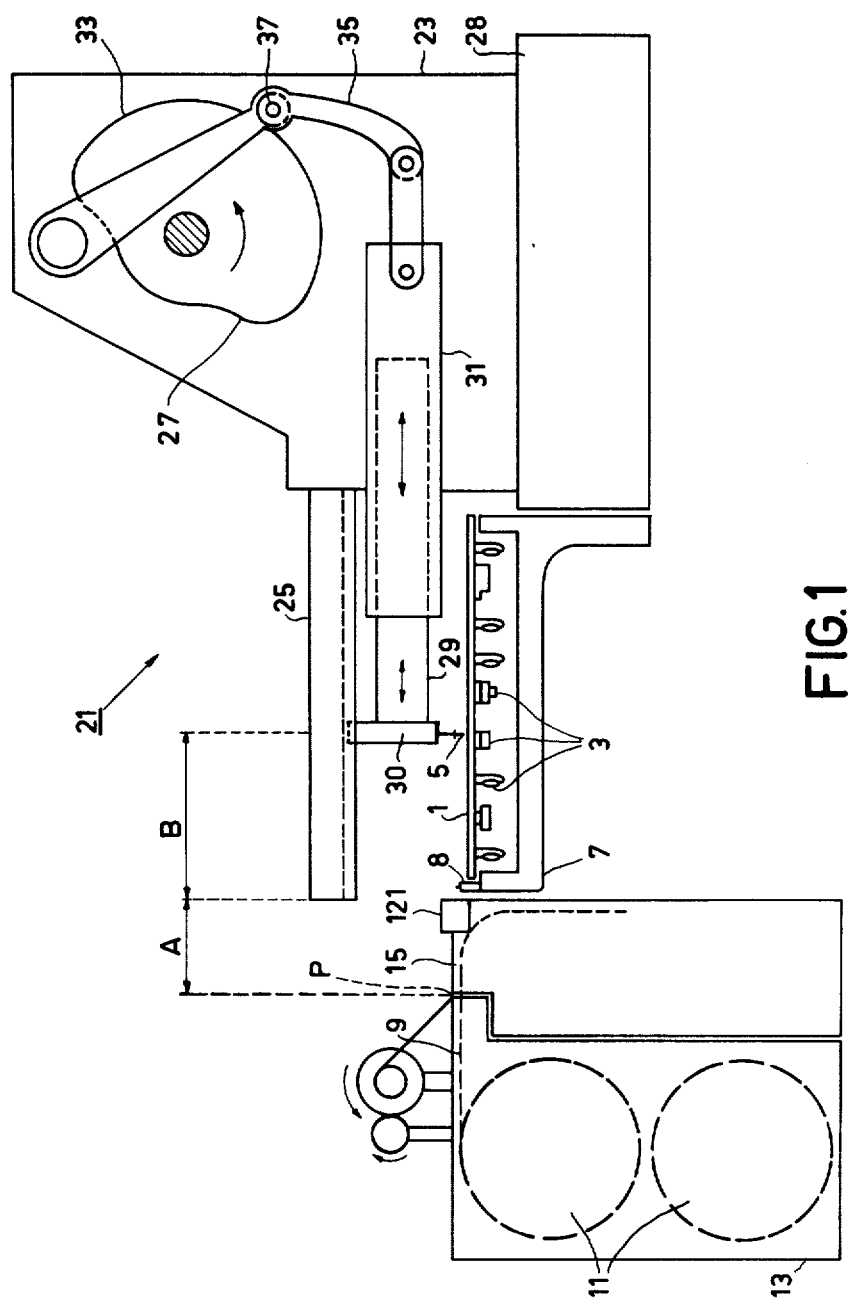
FIG. 1 is a diagrammatic side view of a device for mounting electrical and/or electronic parts on a substrate.

The reference numeral 1 in FIG. 1 denotes a substrate, for example, a printed circuit board whose lower side has already been provided with conventional components 3 which are arranged in holes in the substrate by way of their lead wires. On the top side of the substrate a large number of further components 5 which are very small and which do not have lead wires must be mounted. The dimensions of this type of component, also referred to as a chip, are in the order of magnitude of millimeters and they must be very accurately positioned on the substrate with a very small spacing. A frequently occurring dimension in $3.2 \times 1.6$ mm. The substrate 1 is supported by a substrate carrier 7 which comprises positioning elements 8. The components 5 to be positioned are packed in tapes 9 provided with sprocket holes. The components are loosely positioned in openings in the tapes which are closed at the lower side by a lower foil and at the upper side by a cover foil.

A number of such tapes is wound onto reels 11 in a holder 13. The number of reels present in the holder 13 depends on the circumstances. Thirty-two reels is a customary number which can be rotatably arranged in the holder 13 in two levels. The tapes 9 extend from the reels 11 to a device 15 (not elaborated) for feeding the tapes to a given pick-up position P. In the present embodiment, this device has a 32-fold construction, so that during each cycle thirty-two components 5 are presented. The components 5 are removed from the tapes 9 and are transferred to the substrate 1 by a transfer device 21. The transfer device 21 mainly consists of a frame 23, a transfer mechanism 25, a drive mechanism 27 and the already described substrate carrier 7. These parts are mounted on a frame 28.

Figure 2:
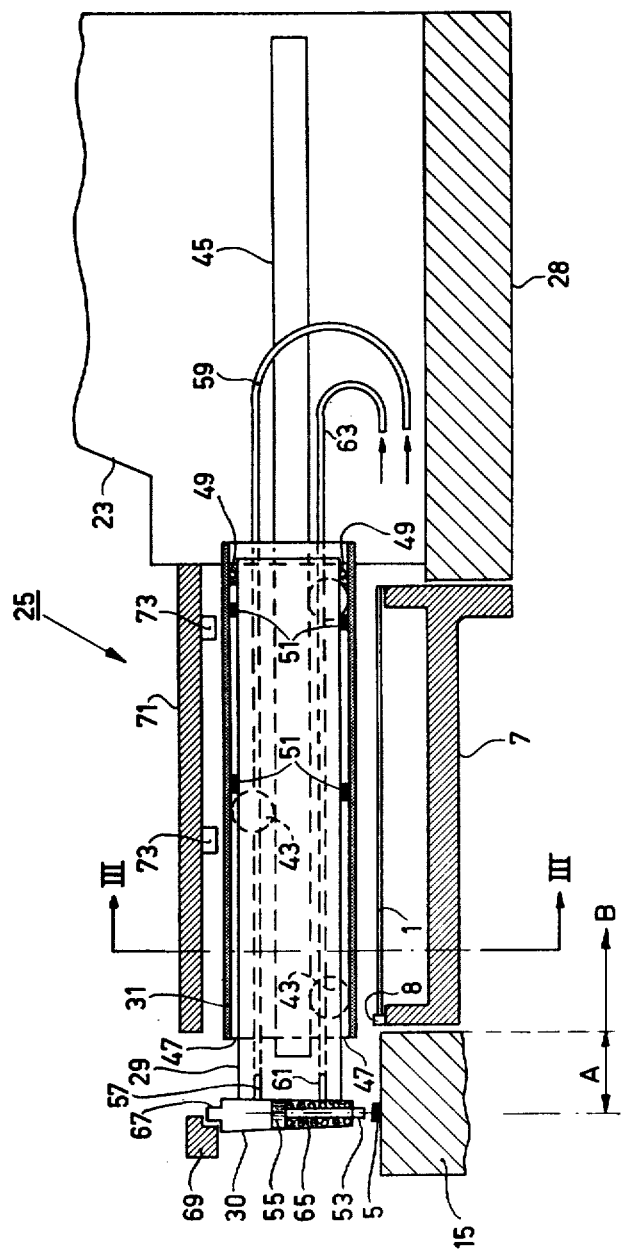
FIG. 2 is a diagrammatic longitudinal sectional view, taken along the line II—II in FIG. 3, of a transfer device in the pick-up position which forms part of the device shown in FIG. 1.
Figure 3:
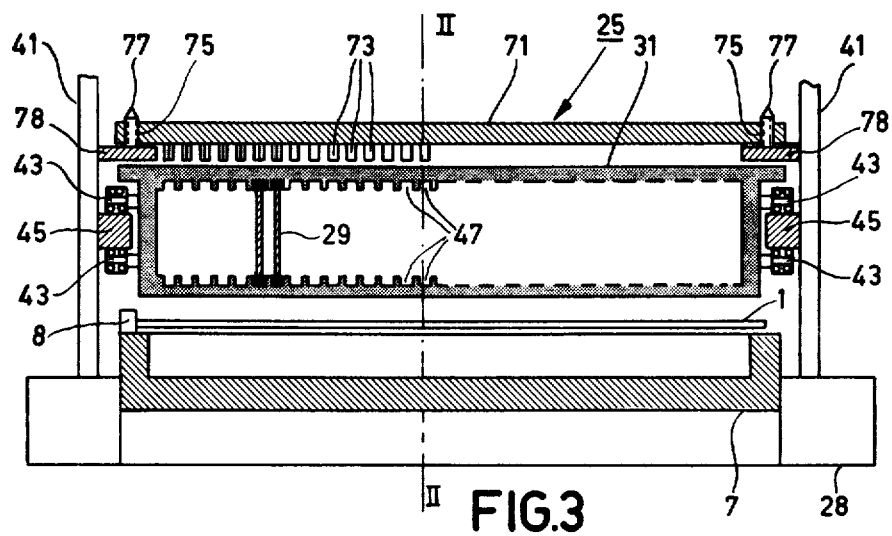
FIG. 3 is a sectional view of the transfer device, taken according to the line III—III in FIG. 2.
Figure 4:
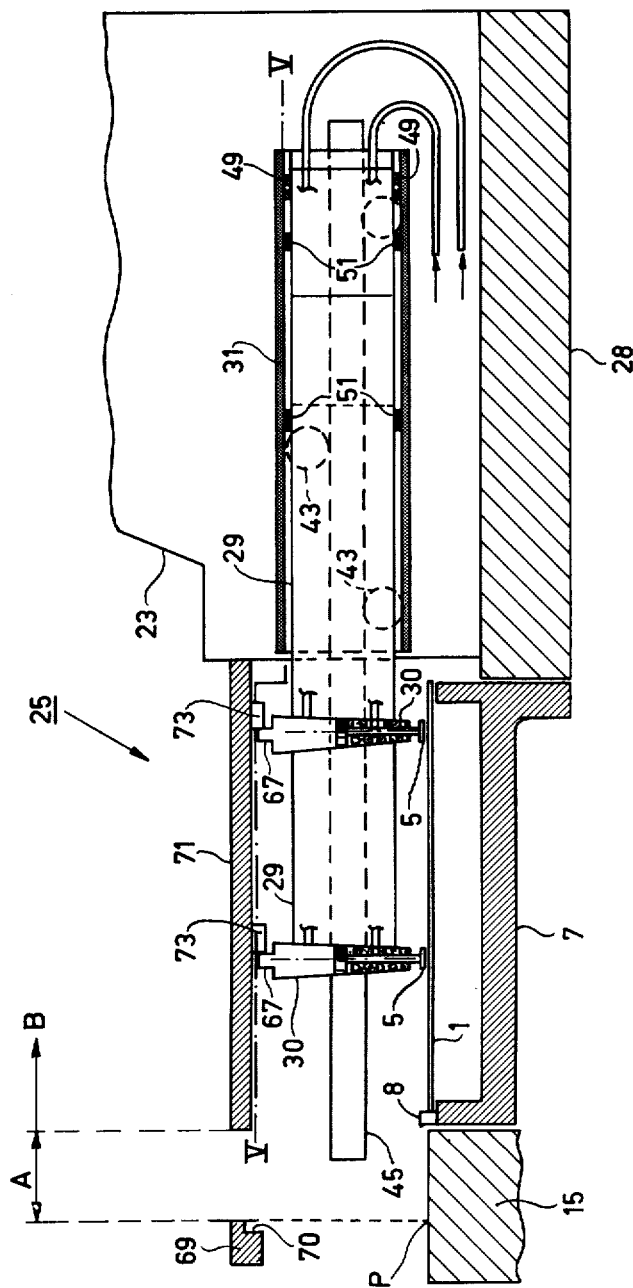
FIG. 4 is a sectional view of the transfer device in the mounting position, taken along the line IV—IV in FIG. 5.
Figure 5:
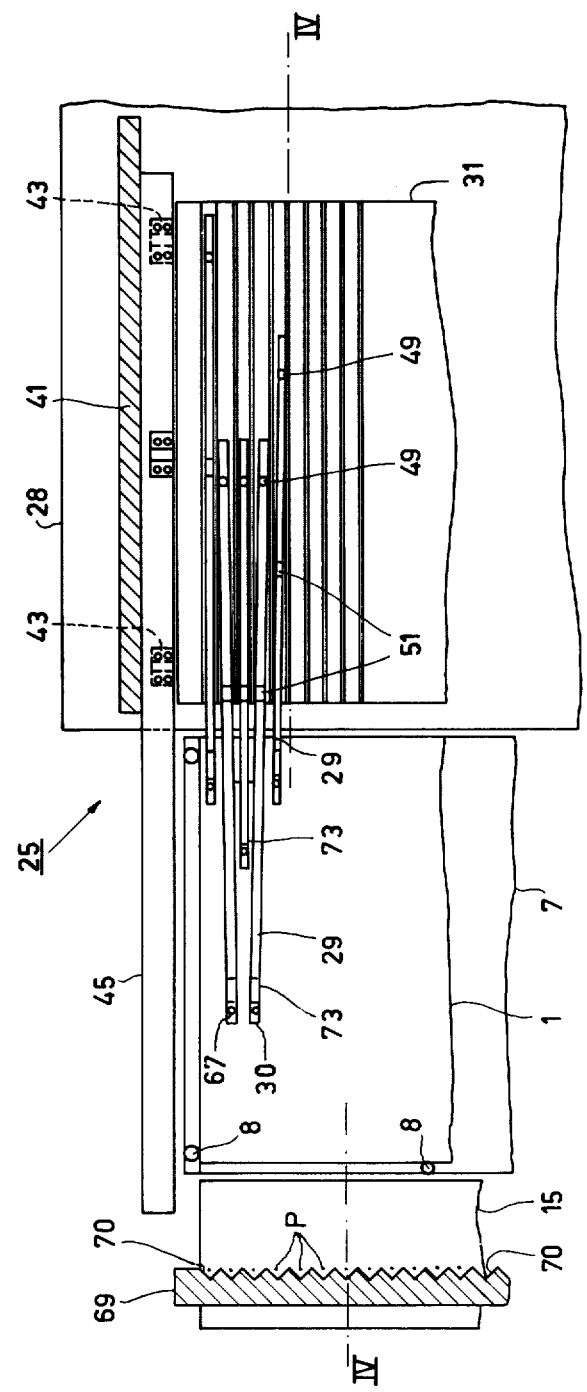
FIG. 5 is a sectional view of the transfer device, taken along the line V—V in FIG. 4.
Figure 6:
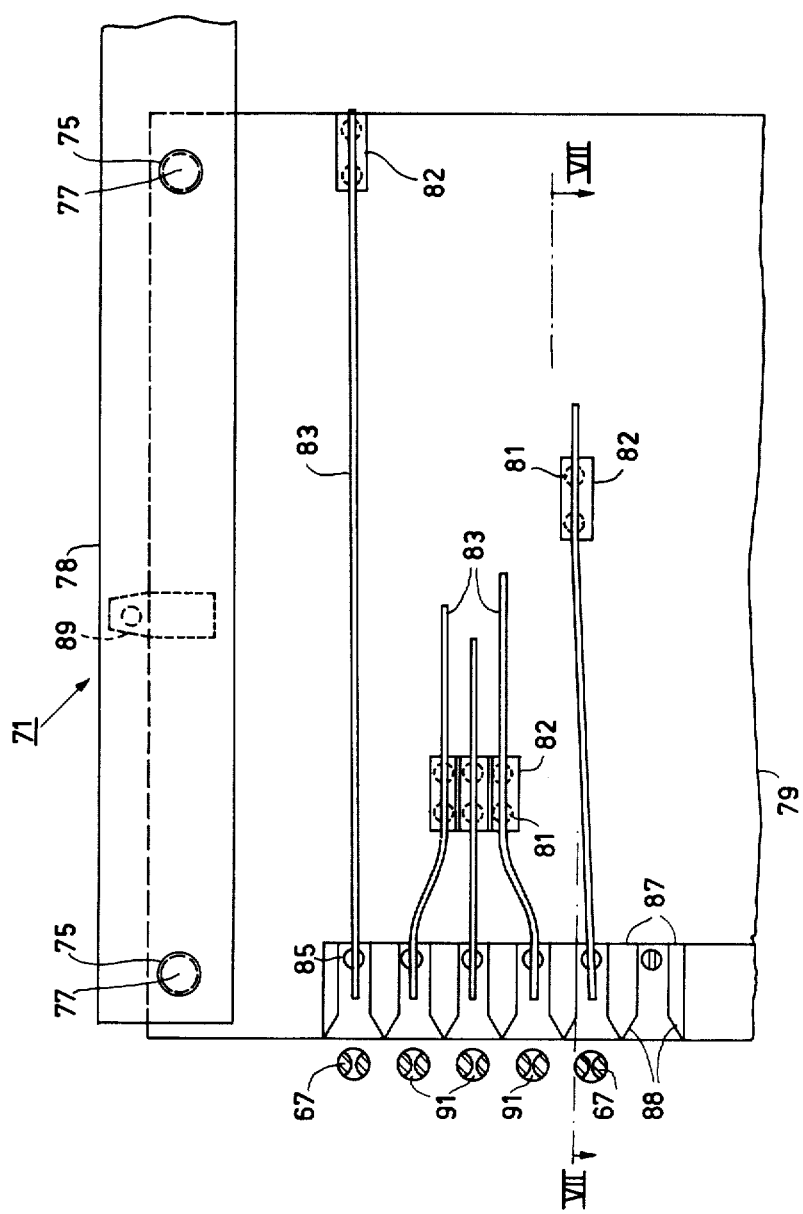
FIG. 6 is a bottom view at an increased scale of a part of the program plate, taken along the line VI—VI in FIG. 7.
Figure 7:
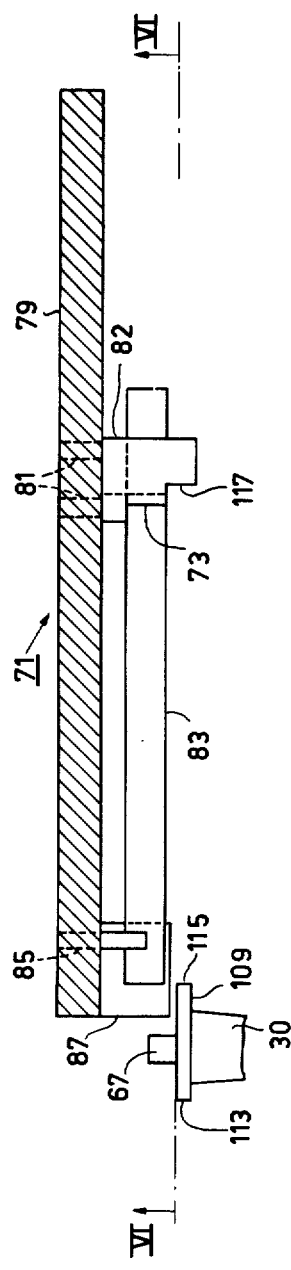
FIG. 7 is a sectional view of the program plate, taken along the line VII—VII in FIG. 6.

The transfer mechanism 25 comprises a number of transfer arms 29, which amounts to thirty-two in the present embodiment equal to the number of parts to be simultaneously transferred. Each transfer arm 29 comprises a pick-up 30. The transfer arms 29 are independently slidable in a single common slide 31 which is slidable in the frame 23. The slide is driven in a reciprocating manner by the drive mechanism 27 which is shown in FIG. 1 and which comprises a motor (not shown), a cam disc 33 and a lever 35 with a cam-follower roller 37. The frame 23 mainly consists of two side walls 41 which are shown in FIG. 3. The slide 31 has a tubular shape and a rectangular cross-section. Its reciprocating movement is guided by rollers 43 by means of which the slide is journalled on two rails 45 which are secured on the inner sides of the side walls 41 and which freely project from the frame 23 beyond the carrier 7. The slide 31 is freely movable between the side walls 41. On the horizontal inner walls of the slide there are provided parallel grooves 47, thirty-two grooves on each wall in the present embodiment. These grooves 47 also serve for the slidable guiding of a corresponding number of transfer arms 29 in cooperation with ball bearings 49 and sliding blocks 51. The ball bearings 49, one at the top and one at the bottom of each transfer arm, ensure that the transfer arms are journalled without side play at their rear end. As a result of this journalling, the vertical position of the transfer arms is maintained. The sliding blocks 51 are proportioned so that some play exists between the transfer arms 29 and the slide 31 in the transverse direction, the transfer arms then pivoting about the ball bearings 49 which define a vertical pivot axis. Each transfer arm 29 comprises a pick-up 30 which is arranged at the end remote from the frame 23 and which comprises a pipette 53 in the present embodiment. Via a piston 55, the pipette 53 is slidable in the vertical direction (FIG. 2). Each transfer arm 29 comprises a compressed air duct 57 which is connected, via a tube 59, to a compressed air source and which communicates with the space in the pick-up 30 above the piston 55. Furthermore, in each transfer arm 29 there is provided a vacuum duct 61 which is connected to a vacuum source, via a tube 63, and which can be made to communicate with the pipette 53. The pipette is maintained in a neutral position shown in FIG. 2 by means of a spring 65, the transfer arms 29 then being in the pick-up position and ready to pick-up a component 5 present in the feed device 15. In this position, a finger 67 at the top end of each pick-up 30 abuts against an abutment rod 69 which is provided with recesses 70 (FIG. 4) and which acts as a multiple fixed abutment. The reference numeral 71 denotes a program plate which is arranged on the frame in such a manner as to be exchangeable and which comprises end stops 73 which are contacted by the fingers 67 on the pick-ups 30 and against which the transfer arms 29 come to rest in the mounting position shown in FIG. 4. As is shown in FIG. 3, the program plate 71 is accurately positioned with respect to the frame 23 by means of centering holes 75 which cooperate with centering pins 77. The program plate 71 bears on two elongate supports 78 which are mounted on the side walls 41 of the frame 23. The FIGS. 6 and 7 are a bottom view and a longitudinal sectional view, respectively, at an increased scale of the program plate 71 with the centering holes 75 and the end stops 73. The program plate comprises a plate-like body 79 which is provided with bores 81 in which there are secured abutment blocks 82 provided with the abutments or end stops 73. On its entrance side which is remote from the frame, the program plate 71 comprises catch elements 87 which form lead-in funnels 88. Leaf springs 83 which act as flexible guide elements are secured in the lead-in funnels by means of pins 85 which are provided with a slot. At the other end, the leaf springs 83 are secured in the abutment blocks 82. The program plate 71 is clamped onto the supports 78 by means of clamping elements 89 which can be readily detached and secured. The leaf springs or guide elements 83 cooperate with the fingers 67 on the pick-ups 30, these fingers comprising a slot 91 for this purpose.

Figure 9:
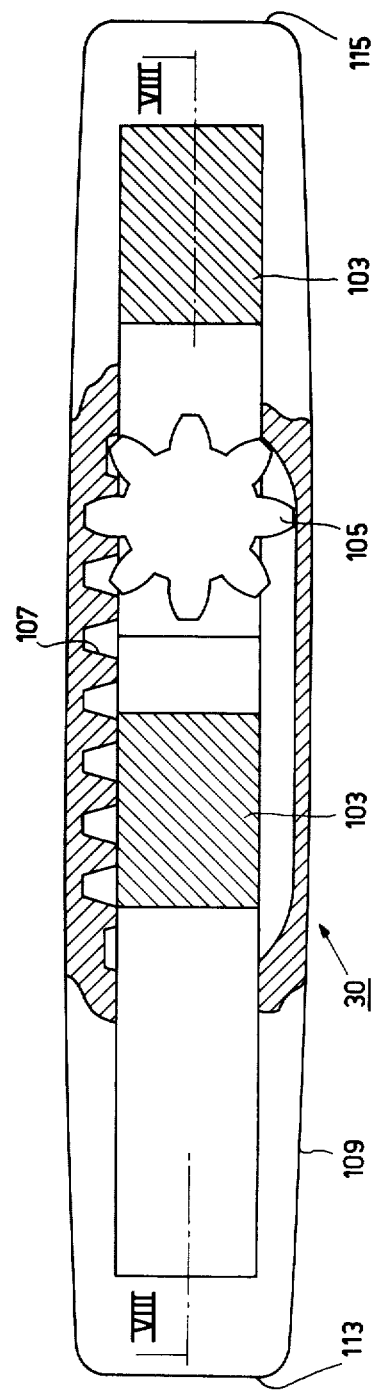
FIG. 9 is a partial cross-sectional view of the pick-up, taken along the line IX—IX in FIG. 8.
Figure 8:
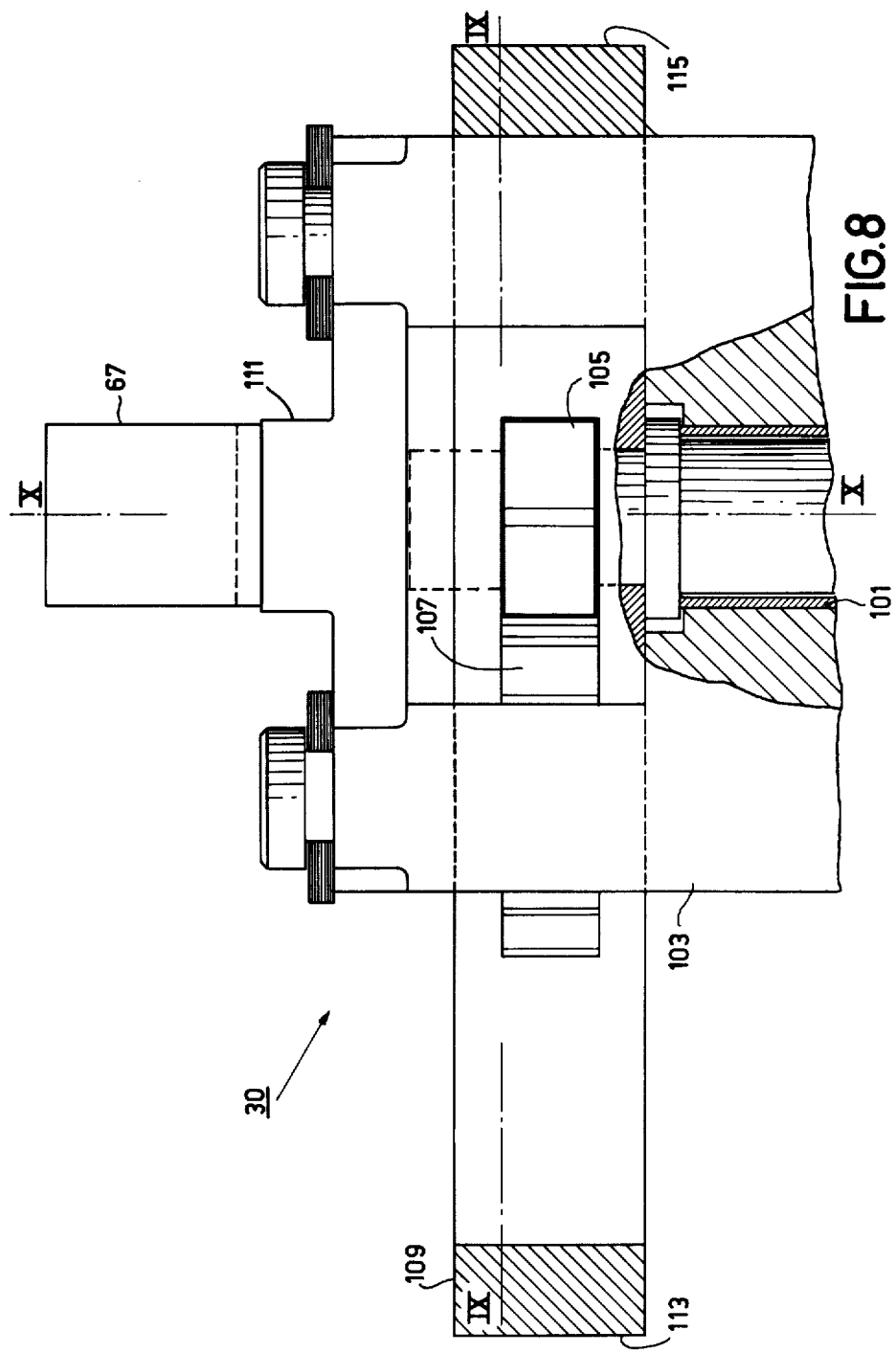
FIG. 8 is a sectional side view of a part of a pick-up, taken along the line VIII—VIII in FIG. 9.
Figure 10:
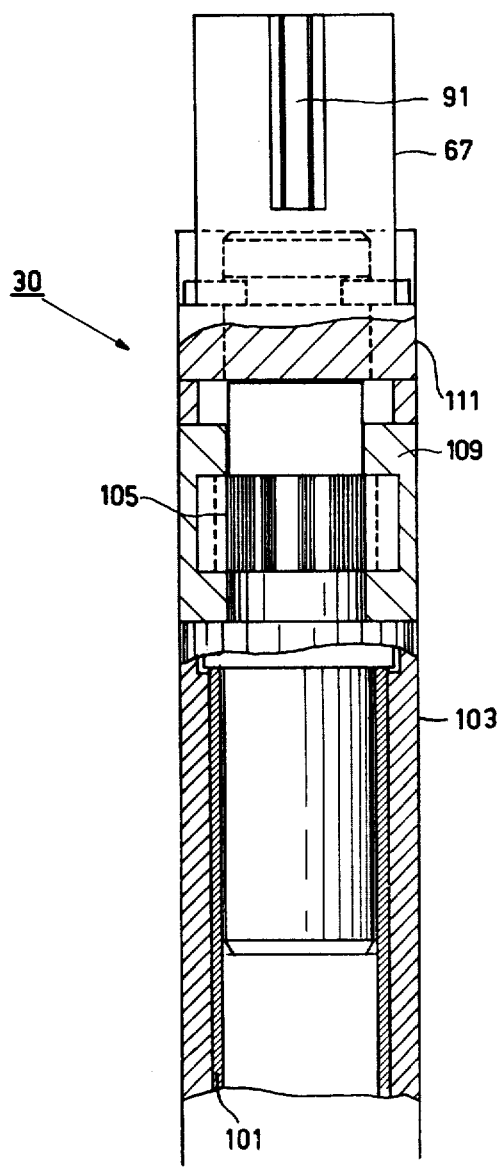
FIG. 10 is a longitudinal sectional view of the pick-up, taken along the line X—X in FIG. 8.

The FIGS. 8, 9 and 10 show, at an increased scale, the upper end of a pick-up 30 with a sleeve 101 which is rotatable in the housing 103 of the pick-up and which is coupled to the pipette (not shown). The housing 103 has an elongate cross-section. The sleeve 101 is coupled to a pinion 105 which engages a rack 107 which forms part of a sliding element 109; the sliding element is slidably journalled on the housing 103 by means of a closing piece 111 on which the finger 67 with the slot 91 is provided. The pinion 105 is located between the housing 103, the sliding element 109 and the closing piece 111. The end faces 113 and 115 of the sliding element 109 act as abutment faces.

Figure 11:
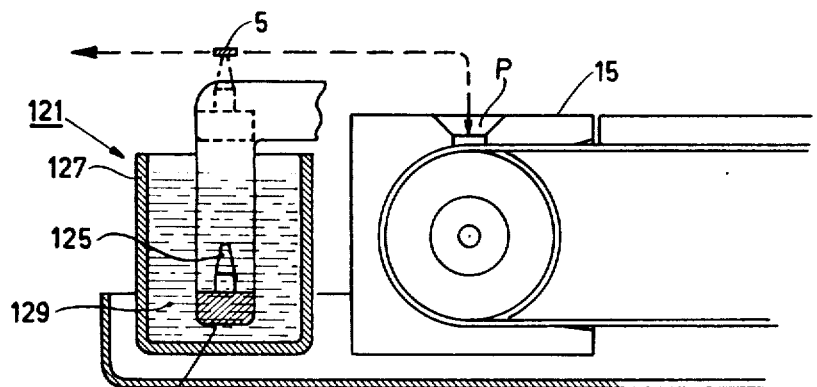
FIG. 11 is a partially diagrammatic sectional side view of a mechanism for the application of a fixing medium, forming part of the device of FIG. 1.
Figure 12:
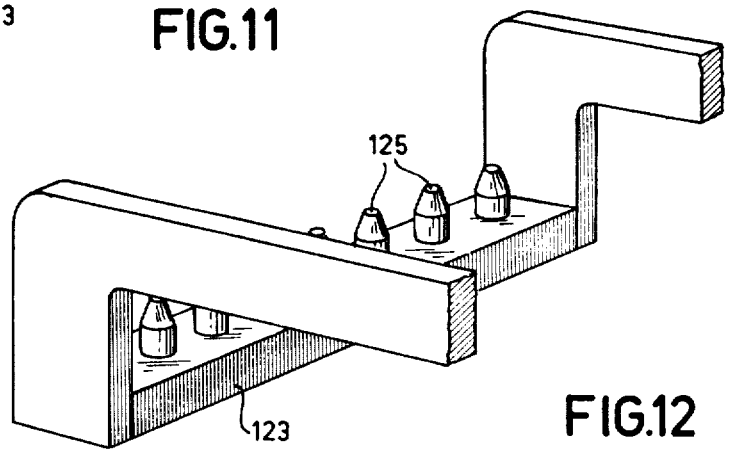
FIG. 12 is a perspective view of a part of the mechanism shown in FIG. 11.

FIGS. 11 and 12 diagrammatically show a mechanism 121 for applying a fixing medium to the lower side of the components 5 to be positioned. This mechanism comprises mainly an elongate arm 123 which is pivotable between a rest position (denoted by solid lines in FIG. 11) and an operating position which is denoted by broken lines. The arm 123 comprises stamps 125 which are arranged in one row and the number of which equals the number of components to be positioned. The mechanism 121 furthermore comprises an elongate container 127 which contains a fixing medium 129. The pivoting movements of the arm 123 can be derived from the drive mechanism 27 which is diagrammatically shown in FIG. 1. The reference numeral 15 denotes the feeding device which feeds the components to be positioned to the pick-up position P. In the rest position, the arm 123 with the stamps 125 is submerged in the fixing medium 129 in the container 127. During the displacement of the arm 123 from the rest position to the active position, the stamp pick up a quantity of fixing medium, come into contact with the lower side of the stationary components 5 which are supported by the pick-ups 30, deposit a quantity of the fixing medium to the components, and return to their rest position. The location of the mechanism 121 is diagrammatically shown in FIG. 1.

The cycle of the device will be described in detail hereinafter. First of all, all 32 transfer arms 29 with the thirty-two pick-ups 30 must be placed in their pick-up position. To this end, the slide 31 is slid in the direction of the abutment rod 69 by the drive mechanism 27. The sliding blocks 51 move in the grooves 47 of the slide 31 with an accurately defined friction. The friction is adjusted to such a value that when the slide 31 is driven, the transfer arms 29 also move. However, as soon as a transfer arm 29 contacts an abutment by way of the finger 67 on the respective pick-up 30, the transfer arm with the pick-up remains stationary and the slide 31 can continue its movement, the sliding blocks 51 and the ball bearings 49 then moving throuh the grooves 47 in the slide 31.

During the displacement of the slide 31 to the pick-up position, the transfer arms 29 move forward until all pick-ups 30 contact the fixed abutment rod 69 by way of their finger cam 67, so that they are stationary in their pick-up position. The fingers 67 and the recesses 70 in the abutment rod 69 are shaped, proportioned and adjusted so that in the pick-up position of the transfer arms, the center line of the pipettes 53 is exactly over the pick-up points P of the components arranged in the pick-up position (FIG. 2). Subsequently, the pipettes 53 are moved downwards by compressed air, the components 5 are picked up by the pipettes 53 connected to a vacuum source, and are retained thereby. After the closing of the compressed air supply, the pipettes are raised again, the slide 31 is moved backwards, the transfer arms 29 being taken along again, and the pick-ups 30 traveling as far as the entrance side of the program plate 71. All pick-ups then have completed a first path segment A according to a straight line, parallel to one another and over the same distance. At the entrance side of the program plate 71 there are provided the catch elements 87 with the lead-in funnels 88 which lead to the ends of the flexible guide elements 83 (FIG. 6). The other end portion of each guide element is secured in an abutment block 82 so that a pick-up 30 is retained by the end stop 73 in a mounting position which is exactly above the landing area of the component to be positioned on the substrate. The fingers 67 on the pick-ups are guided by the lead-in funnels to the guide elements 83, grip around the guide elements by way of their slot 91, and follow the path of these elements as far as the end stops 73 whereagainst the transfer arms 29 come to a standstill by way of the finger 67 on their pick-ups 30. The pick-ups have then traveled a second path segment B, with or without lateral displacement and over the same distance or not.

When all pick-ups 30 have reached the end stops 73, the pipettes 53 are moved down again by means of compressed air and the components 5 are positioned on the substrate 1 after removal of the vacuum. Subsequently, the pipettes are raised again. Finally, the slide 31 is moved forward again until all pick-ups 30 again contact the fixed abutment rod 69.

In a practical embodiment of the device for the simultaneous transfer of 32 components, the transfer mechanism comprised 32 transfer arms and a program plate with 32 guide elements and 32 abutments. The pitch of the grooves in the slide and of the transfer arms amounted to 10 mm. The components were presented in one row with a pitch of 15 mm. The width of the transfer arms and the thickness of the pick-ups amounted to 5 mm. The pick-ups had a feasible lateral displacement of 5.5 mm in one direction. Therefore, each pick-up could cover a field having a width of 11 mm. The slide had a maximum useful stroke of 210 mm. Using this device, substrates having the maximum dimensions of $120 \times 321$ mm could be provided with components. The duty cycle amounted to 2.4 seconds. The maximum production rate was 48,000 components per hour. The positioning accuracy amounted to $\pm 0.05$ mm.

In the embodiment shown (FIG. 1), the components are supplied in a tape. However, the components can alternatively be supplied in any other suitable manner, for example, in magazines or in bulk; it suffices that the components are presented in a fixed pattern in the pick-up position.

When use is made of the embodiment of the pick-up 30 shown in the FIGS. 8, 9 and 10, a rotary movement can be imparted to the pipettes if rotation of the relevant components is desirable. As is diagrammatically shown in FIG. 7, the abutment blocks 82 then comprise a second abutment 117 which cooperates with the abutment face 115 on the sliding element 109 in order to realize a rotation of the pinion 105 and hence a rotation of the pipette. In order to realize a rotary movement of the pipettes through an angle of 90°, 180° or 270°, adapted abutment blocks of suitable dimensions must be mounted on the program plate. The pipette can rotate against the force of a spring which serves to return the pipette to the starting position. The pipette can also be returned to the starting position by means of a second abutment on the abutment rod 69 which is comparable to the abutment 117 on the abutment block 82 and which cooperates with the end face 113 on the sliding element 109.

The substrate can be locally provided with an adhesive in known manner, for example, glue, solder paste etc. However, this requires a special tool such as a silk-screening device or a multiple stamp which is adapted to the pattern of the substrate. By application of the fixing medium to the components by means of the mechanism shown in the FIGS. 11 and 12, the fixing medium can be simply and cheaply applied. This mechanism is not specific of a given substrate and need not be exchanged.

In the described embodiment, the fixed abutments which define the pick-up position of the pick-ups are constructed as an abutment rod. Obviously, individual fixed abutments can be used as well.

The described device comprises pick-ups which include a pipette. However, groups or combinations of a pipette and an alignement grip can alternatively be used. If necessary or desirable, the components can be aligned after pick-up, individually by means of alignment grips or together by means of a suitable device.

The program plate comprises flexible guide elements. Rigid guide elements such as grooves or ribs can alternatively be used.

Ultimately, facilities can be provided to test whether or not all pick-ups have indeed picked up a component, so that any missing component can be supplied as yet.

During the displacement of the components to the mounting position, the pipettes are connected to a vacuum source. At each pipette the vacuum is measured. If the vacuum is not sufficient, it is assumed that no component is attached to the pipette and the pipette will not perform a vertical stroke for the positioning of the component. In order to enable such a procedure, all pipettes comprise an electronically controlled valve which is capable of admitting the compressed air for the vertical stroke. After the other pipettes have completed their cycle, all pipettes return to their pick-up position. Subsequently, only the pipette which has not positioned a component picks up a component and positions it on the substrate. The other pipettes then do not make a vertical stroke during pick-up and deposition.

The substrate which is diagrammatically shown in FIG. 1 has already been provided with conventional components whose lead wires are positioned in holes in the substrate. Evidently, the method and the device in accordance with the invention also enable components without connection wires to be positioned in a similar manner on substrates without holes.

What is claimed is:

1. A method of positioning components on a substrate, in which a number of parts are simultaneously transferred from a pick-up position to a mounting position so as to be positioned on the substrate, characterized by comprising
   presenting a plurality of components in a first geometric pattern having a regular pitch,
   picking up said plurality of components, in said first geometric pattern,
   simultaneously moving said plurality of components along a first path segment from the pick-up position toward respective mounting positions,
   then changing the relative positions of the components to at least a second, different geometric pattern, and
   positioning said components on a substrate in a geometric pattern different from said first pattern.

2. A method as claimed in claim 1, characterized in that said first pattern is a straight line pattern.

3. A method as claimed in claim 2, characterized in that said first path segment is a straight line, and that said changing step comprises displacing said components along second path segments having different selected distances for respective components.

4. A method as claimed in claim 3, characterized in that said changing step comprises positioning at least one component relative to the others in a direction transverse to the direction of movement along said first path segment.

5. A method as claimed in claim 2, 3 or 4, characterized in that said moving step comprises translating said components in a direction transverse to said first pattern, and said changing step comprises moving said components further respective distances in said direction transverse to said first pattern.

6. A method as claimed in claim 5, characterized by the additional step of applying a fixing medium to all components simultaneously, on the first path segment.

7. A method as claimed in claim 3, characterized by the additional step of applying a fixing medium to all components simultaneously, on the first path segment.

8. A method as claimed in claim 1, characterized by the additional step of applying a fixing medium to all components simultaneously, on the first path segment.

9. A method as claimed in claim 1, characterized in that said first path segment is a straight line, and that said changing step comprises displacing said components along second path segments having different selected distances for respective components.

10. A method as claimed in claim 9, characterized in that said changing step comprises positioning at least one component relative to the others in a direction transverse to the direction of movement along said first path segment.

11. A method as claimed in claim 1, characterized in that said changing step comprises positioning at least one component relative to the others in a direction transverse to the direction of movement along said first path segment.

12. A method as claimed in claim 11, characterized by the additional step of applying a fixing medium to all components simultaneously, on the first path segment.

13. A device for placing a plurality of components simultaneously on a substrate, means for supplying a plurality of components at a pick-up position, arranged in a first geometric pattern; and a transfer mechanism for moving said components simultaneously and mounting the components against a substrate on said carrier, characterized in that said transfer mechanism comprises
   a guide,
   a plurality of transfer arms, each slidably mounted in said guide, each arm further comprising a pick-up element for a component,
   common drive means for moving the transfer arms in said guide between the pick-up and mounting positions,
   first abutment means for defining the pick-up position for the pick-up arms, and
   second abutment means for defining the respective mounting positions for individual pick-up arms.

14. A device as claimed in claim 13, characterized in that the guide is a slide, and said common drive means displaces the slide in a given direction, and
   each transfer arm is slidably journalled in the slide for relative movement in the direction of slide displacement.

15. A device as claimed in claim 14, characterized in that said second abutment means comprises an exchangeable program plate having individual abutments for each respective transfer arm.

16. A device as claimed in claim 15, characterized by comprising a frame to which said carrier, means for supplying and transfer mechanism are attached, and
   further characterized in that said first abutment means is permanently arranged on the frame and defines a pattern of component pick-up positions at a regular pitch.

17. A device as claimed in claim 15 or claim 16, characterized in that said transfer arms are each journalled for limited movement in the slide in a direction transverse the direction of slide displacement, and
   said program plate comprises guides for transversely positioning said transfer arms.

18. A device as claimed in claim 17, characterized in that the program plate comprises a plurality of catch elements arranged at the entrance side, one for each respective transfer arm; and in that each guide connects a catch element to a respective abutment on the program plate.

19. A device as claimed in claim 18, characterized in that said first and second abutment means together comprise a finger on each pick-up element.

20. A device as claimed in claim 19, characterized in that said pick-up element comprises a housing; a pipette rotatably journalled in said housing, a pinion coupled to the pipette, and a rack engaged by the pinion and arranged to engage an abutment on the program plate to provide rotation of the pipette.

21. A device as claimed in claim 20, characterized by comprising a mechanism for applying a fixing medium to the components, comprising
    an elongate arm comprising a plurality of stamps,
    means for displacing said arm between a rest position, and an operating position in which the stamps contact lower sides of the components, and
    means for applying a quantity of fixing medium to the stamps in the rest position.

22. A device as claimed in claim 15, characterized in that said pick-up element comprises a housing; a pipette rotatably journalled in said housing, a pinion coupled to the pipette, and a rack engaged by the pinion and arranged to engage an abutment on the program plate to provide rotation of the pipette.

23. A device as claimed in claim 22, characterized by comprising a mechanism for applying a fixing medium to the components, comprising
    an elongate arm comprising a plurality of stamps,
    means for displacing said arm between a rest position, and an operating position in which the stamps contact lower sides of the components, and
    means for applying a quantity of fixing medium to the stamps in the rest position.

24. A device as claimed in claim 14, characterized by comprising a frame to which said carrier, means for supplying and transfer mechanism are attached, and
    further characterized in that said first abutment means is permanently arranged on the frame and defines a pattern of component pick-up positions at a regular pitch.

25. A device as claimed in claim 13, characterized by comprising a frame to which said carrier, means for supplying and transfer mechanism are attached, and
    further characterized in that said first abutment means is permanently arranged on the frame and defines a pattern of component pick-up positions at a regular pitch.

26. A device as claimed in claim 13, characterized in that said second abutment means comprises an exchangeable program plate having individual abutments for each respective transfer arm.

27. A device as claimed in claim 13, characterized in that said first and second abutment means together comprise a finger on each pick-up element.

28. A device as claimed in claim 13, characterized by comprising a mechanism for applying a fixing medium to the components, comprising
    an elongate arm comprising a plurality of stamps,
    means for displacing said arm between a rest position, and an operating position in which the stamps contact lower sides of the components, and
    means for applying a quantity of fixing medium to the stamps in the rest position.

* * * * *

UNITED STATES PATENT AND TRADEMARK OFFICE
CERTIFICATE OF CORRECTION

PATENT NO. : 4,480,780

DATED : November 6, 1984

INVENTOR(S) : LOUIS V. CLAESKENS, GEORGE VAN DE VEN

It is certified that error appears in the above-identified patent and that said Letters Patent is hereby corrected as shown below:

Claim 13, line 2, after "substrate" insert --comprising--

Signed and Sealed this

Thirtieth Day of April 1985

[SEAL]

Attest:

DONALD J. QUIGG

Attesting Officer — Acting Commissioner of Patents and Trademarks